(12) United States Patent
Shu et al.

(10) Patent No.: US 11,927,816 B2
(45) Date of Patent: Mar. 12, 2024

(54) OPTICAL MODULE OPTIMIZED FOR EMI SHIELDING PERFORMANCE AND ELECTROMAGNETIC SHIELDING STRUCTURE OF THE OPTICAL MODULE

(71) Applicant: Wuhan HGGenuine Optics Tech Co., Ltd., Wuhan (CN)

(72) Inventors: Kun Shu, Wuhan (CN); Yong Zhang, Wuhan (CN); Qijian Xu, Wuhan (CN); Yu Zhai, Wuhan (CN)

(73) Assignee: Wuhan HGGenuine Optics Tech Co., Ltd., Wuhan (CN)

( * ) Notice: Subject to any disclaimer, the term of this patent is extended or adjusted under 35 U.S.C. 154(b) by 224 days.

(21) Appl. No.: 17/581,994

(22) Filed: Jan. 24, 2022

(65) Prior Publication Data
US 2022/0252802 A1 Aug. 11, 2022

Related U.S. Application Data

(63) Continuation of application No. PCT/CN2021/077165, filed on Feb. 22, 2021.

(30) Foreign Application Priority Data

Feb. 5, 2021 (CN) .......................... 202110160748.8

(51) Int. Cl.
*G02B 6/42* (2006.01)
*H05K 9/00* (2006.01)

(52) U.S. Cl.
CPC ......... *G02B 6/4277* (2013.01); *G02B 6/4278* (2013.01); *H05K 9/002* (2013.01); *H05K 9/0058* (2013.01)

(58) Field of Classification Search
CPC ... H05K 9/0058; G02B 6/4277; G02B 6/4278
See application file for complete search history.

(56) References Cited

U.S. PATENT DOCUMENTS

2011/0206328 A1* 8/2011 Wang ................... G02B 6/4278
385/94
2015/0331210 A1* 11/2015 Lee ...................... G02B 6/4277
385/89
(Continued)

FOREIGN PATENT DOCUMENTS

CN 202472064 U 10/2012
CN 205750009 U 11/2016
(Continued)

*Primary Examiner* — Hung V Ngo
(74) *Attorney, Agent, or Firm* — Bayramoglu Law Offices LLC

(57) ABSTRACT

An optical module optimized for EMI shielding performance and electromagnetic shielding structure of the optical module includes a base, an upper cover, and an unlocking device connected by an unlocking handle and a movable unlocking piece; the base is butted and clamped with the upper cover to form a limiting groove for accommodating the unlocking latch on both sides of the movable unlocking piece, the unlocking latch is correspondingly slidably fitted in the limiting groove; the upper end of the unlocking latch on each side is provided with a first notch, which is used to make way for the base EMI lug boss set on the base, the lower end of the unlocking latch on each side is provided with a second notch, which is used to make way for the upper cover EMI lug boss set on the upper cover.

17 Claims, 6 Drawing Sheets

(56) References Cited

U.S. PATENT DOCUMENTS

| | | | |
|---|---|---|---|
| 2017/0160502 A1 | 6/2017 | Zhao et al. | |
| 2017/0168249 A1* | 6/2017 | Maeda | G02B 6/4277 |
| 2017/0168253 A1* | 6/2017 | Wilcox | G02B 6/4278 |
| 2020/0285006 A1* | 9/2020 | Matsui | H04B 10/40 |
| 2021/0141176 A1* | 5/2021 | Lu | G02B 6/428 |
| 2022/0019040 A1* | 1/2022 | Lu | G02B 6/4246 |
| 2023/0026337 A1* | 1/2023 | Briant | G02B 6/4268 |

FOREIGN PATENT DOCUMENTS

| | | |
|---|---|---|
| CN | 109254360 A | 1/2019 |
| CN | 109828336 A | 5/2019 |
| WO | 2020024109 A1 | 2/2020 |

* cited by examiner

OPTICAL MODULE OPTIMIZED FOR EMI SHIELDING PERFORMANCE AND ELECTROMAGNETIC SHIELDING STRUCTURE OF THE OPTICAL MODULE

CROSS REFERENCE TO THE RELATED APPLICATIONS

This application is the Continuation Application of International Application No. PCT/CN2021/077165, filed on Feb. 22, 2021, which is based upon and claims priority to Chinese Patent Application No. 202110160748.8, filed on Feb. 5, 2021, the entire contents of which are incorporated herein by reference.

TECHNICAL FIELD

The present invention relates to the photoelectric technology field, specifically, to an optical module optimized for electromagnetic radiation (EMI) shielding performance and electromagnetic shielding structure of the optical module.

BACKGROUND

Under the current demand of 5G communication and cloud computing big data-related applications, the transmission rate and the signal frequency of optical modules is getting higher and higher, the base frequency of the current 400G optical module can reach 26.56 GHZ, at the same time, the power consumption of the optical module itself is getting higher and higher. With the increase in signal frequency and module power consumption, the EMI of the module will be stronger, and the shielding ability of the optical module structure needs to be improved, otherwise the customer's requirements for EMI testing cannot be met.

The main principle of electromagnetic shielding is the Faraday cage principle, a closed "CAGE" is formed by conductor, and the source of electromagnetic radiation is enclosed in this "CAGE", this "CAGE" can be allowed to have holes or gaps, but the maximum length of the gap directly affects the shielding effectiveness of this "CAGE". The shielding effectiveness of this gap is usually determined by the wavelength of the electromagnetic wave, the longer the wavelength, the great the length of the gap that allowed to achieve the equal shielding effectiveness. According to the electromagnetic wavelength in the air equal to the speed divided by the frequency; the wavelength of the electromagnetic wave at the 26.5G frequency is 11.32 mm. Generally, when the gap of our structural parts reaches 1/20 of the wavelength, that is, 0.566 mm, the shielding effectiveness can reach about 20 dB, in ordinary applications, we think this has reached the limit of structural shielding.

The electromagnetic shielding scheme of the optical module generally achieves the shielding effect by inserting the module into a CAGE, and then buckling the CAGE on a single board. As an optical module level shielding scheme, the shielding capability of the optical module structure itself to the radiation of internal components must be solved first; secondly, it is necessary to solve the shielding effectiveness generated when the module is matched with the CAGE on the single board, that is, to ensure that the optical module has good contact with the EMI springs in the four directions of the CAGE. Usually the upper and lower sides of the module are required to be plane by the MSA, so there is less space for optimization; for the optical module with the unlocking structure designed on the side, in order to ensure that the internal cavity of the structure has enough space to install the device, the latch of the unlocking structure is generally designed on the outermost side of the structure, so that the side structure is not an integral part, but consists of a base, an upper cover and an unlocking device. Therefore, improving the shielding effectiveness between the optical module and the CAGE can be achieved by optimizing the contact between the side unlocking mechanism area and the CAGE.

SUMMARY

In view of the technical shortcomings and technical disadvantages in the prior art, the present invention provide an optical module optimized for EMI shielding performance and electromagnetic shielding structure of the optical module, considering the design characteristics of the EMI springs of the CAGE, the invention optimizes the matching structure between the movable unlocking piece of the optical module and the EMI springs of the CAGE, thereby reducing the gap between the CAGE and the optical module, so as to improve the shielding efficiency of the optical module and the CAGE.

The technical scheme of the present invention is realized as follows: the present invention discloses an optical module optimized for EMI shielding performance, including a base, an upper cover, and an unlocking device connected by an unlocking handle and a movable unlocking piece; the base is butted and clamped with the upper cover to form a limiting groove for accommodating the unlocking latch on both sides of the movable unlocking piece, the unlocking latch is correspondingly slidably fitted in the limiting groove, the upper end of the unlocking latch on each side is provided with a first notch, which is used to make way for the base EMI lug boss set on the base, the lower end of the unlocking latch on each side is provided with a second notch, which is used to make way for the upper cover EMI lug boss set on the upper cover, so that the three inner EMI springs on each side of the CAGE entrance matched with the optical module respectively and independently contact with the base EMI lug boss, the unlocking latch, and the upper cover EMI lug boss one by one.

Further, among the three inner EMI springs on each side of the CAGE, the distance between the upper and lower inner EMI springs is d, the first notch and the second notch of the unlocking latch on each side are symmetrically arranged in the up-and-down direction, so that the upper and lower width d2 of the unlocking latch at the first notch and the second notch is less than or equal to d.

Further, the effective matching length L between the base EMI lug boss, the unlocking latch, the upper cover EMI lug boss on each side of the optical module and the three inner EMI springs on the corresponding side of the CAGE entrance must meet the requirements that the base EMI lug boss, the unlocking latch and the upper cover EMI lug boss on each side of the optical module respectively and independently contact with the highest points of the three inner EMI springs on the corresponding side of the CAGE entrance.

Further, the base is provided with an EMI partition protrusion, the unlocking latch is provided with an EMI partition groove, the EMI partition groove extends along the sliding direction, and the EMI partition protrusion on the base is slidably fitted in the EMI partition groove of the unlocking latch.

Further, the EMI partition protrusion is located between the base EMI lug boss and the upper cover EMI lug boss.

Further, the end of the unlocking latch on each side is provided with an unlocking EMI springs for realizing the unlocking function.

Further, the unlocking latch is provided with an unlocking stroke control groove, the base is provided with an unlocking stroke control lug boss, the unlocking stroke control lug boss on the base is slidably fitted in the unlocking stroke control groove of the unlocking latch to ensure that the movable unlocking piece cooperates with the unlocking stroke control lug boss on the base during the movement process to realize the stroke control function, and limit the moving direction of the movable unlocking piece at the same time.

Further, the unlocking latch is provided with an upwardly extending upper protrusion and a downwardly extending lower protrusion near the end of the unlocking latch, the base is provided with a limit groove for slidably fitting with the upper protrusion of the unlocking latch, the upper cover is provided with a limit groove for slidably fitting with the lower protrusion, the upper protrusion of the unlocking latch extends into the corresponding limit groove of the base, and the lower protrusion of the unlocking latch extends into the corresponding limit groove of the upper cover, so as to ensure that the unlocking latch will not move out of the limit groove during the movement.

Further, the base is provided with a spring installation groove, and the spring installation groove is provided with a spring, the movable unlocking piece is provided with a reset latch for covering the notch of the spring installation groove, and the reset latch of the movable unlocking piece is provided with a spring plectrum, the spring plectrum of the movable unlocking piece extends into the spring installation groove to compress the spring, and the spring provides a reset force to the movable unlocking piece.

The reset latch spans between the two unlocking latch, and the two sides of the reset latch are respectively connected with the unlocking latch on both sides.

The invention also discloses an electromagnetic shielding structure of the optical module, including a CAGE and the optical module mentioned above, the optical module is inserted into the CAGE, the three inner EMI springs on the left and right sides of the CAGE entrance respectively and independently contact with the base EMI lug bosses, the unlocking latch, and the upper cover EMI lug bosses on the left and right sides of the optical module one by one.

Further, the base EMI lug boss, the unlocking latch and the upper cover EMI lug boss on each side of the optical module respectively and independently contact with the highest points of the three inner EMI springs on the corresponding side of the CAGE entrance.

The present invention has at least the following beneficial effects: since the upper end of the unlocking latch on each side is provided with a first notch, which is used to make way for the base EMI lug boss set on the base, the lower end of the unlocking latch on each side is provided with a second notch, which is used to make way for the upper cover EMI lug boss set on the upper cover, so that the three inner EMI springs on each side of the CAGE entrance respectively and independently contact with the base EMI lug boss, the unlocking latch, and the upper cover EMI lug boss one by one. The structural scheme provided by the present invention can ensure that the three inner EMI springs on each side of the CAGE are in independent contact with the three parts, thereby reducing the gap between the CAGE and the optical module, and can effectively improve the shielding effectiveness of the optical module and the CAGE.

The base of the present invention is provided with an EMI partition point, which can break the matching gap between the unlocking latch (sheet metal) and the base, shorten the gap by half, and improve the shielding efficiency. The EMI partition groove is to ensure that the unlocking latch will not interfere with the EMI partition protrusion on the base during the movement of the unlocking handle.

BRIEF DESCRIPTION OF THE DRAWINGS

In order to illustrate the embodiments of the present invention or the technical solutions in the prior art more clearly, the following will briefly introduce the drawings that need to be used in the description of the embodiments or the prior art. Obviously, the drawings in the following description are only some embodiments of the present invention, for those of ordinary skill in the art, other drawings can be obtained based on these drawings without creative work.

Figure 1:
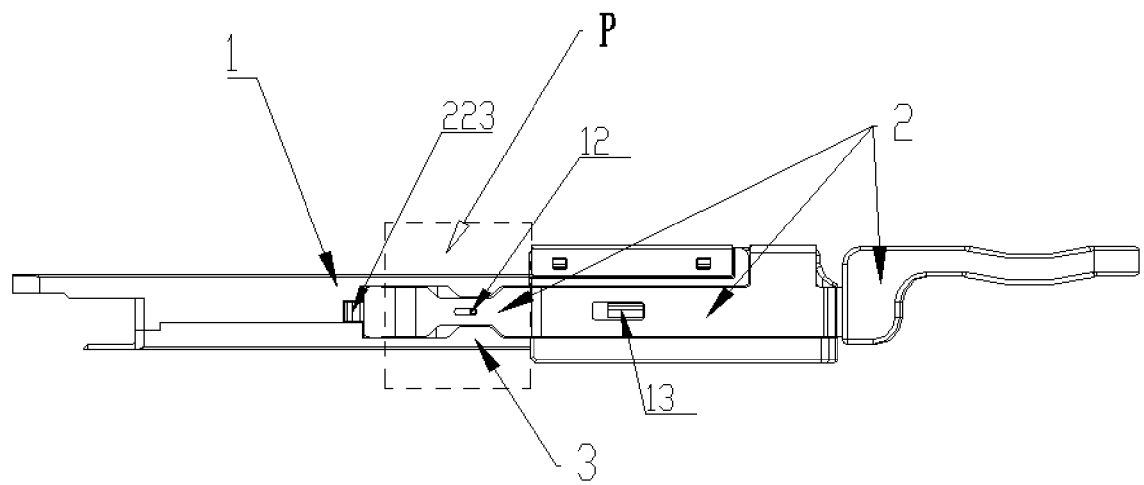
FIG. 1 shows the structure diagram of the optical module optimized for EMI shielding performance provided by an embodiment of the present invention.

In the drawings, 1 is the base, 11 is the base EMI lug boss, 12 is the EMI partition protrusion, 13 is the unlocking stroke control lug boss, 14 is the spring installation groove, 2 is the unlocking device, 21 is the unlocking handle, 22 is the movable unlocking piece, 221 is the unlocking latch, 222 is the reset latch, 223 is the unlocking EMI springs, 224 is the upper protrusion, 225 is the lower protrusion, 226 is the EMI partition groove, 227 is the unlocking stroke control groove, 228 is the spring plectrum, 3 is the upper cover, 31 is the upper cover EMI lug boss, 4 is the spring, 5 is the CAGE, 51 is the inner EMI springs and 52 is the outer EMI springs.

DETAILED DESCRIPTION OF THE EMBODIMENTS

The technical scheme in the embodiments of the present invention will be clearly and completely described below in combine with the accompanying drawings in the embodiments of the present invention. Obviously, the described embodiments are only a part of the present invention, not all of the embodiments. Based on the embodiments of the present invention, all other embodiments obtained by one of ordinary skill in the art without creative work shall fall within the protection scope of the present invention.

EXAMPLE 1

See FIG. 1 to FIG. 8, the embodiment of the present invention provides an optical module optimized for EMI shielding performance, including: a base 1, an upper cover 3, and an unlocking device 2 connected by an unlocking handle 21 and a movable unlocking piece 22, the base 1 is butted and clamped with the upper cover 3 to form a limiting groove for accommodating the unlocking latch 221 on both sides of the movable unlocking piece 22, the unlocking latch 221 is correspondingly slidably fitted in the limiting groove, the upper end of the unlocking latch 221 on each side is provided with a first notch, which is used to make way for the base EMI lug boss 11 set on the base 1, the lower end of the unlocking latch 221 on each side is provided with a second notch, which is used to make way for the upper cover EMI lug boss 31 set on the upper cover 3, so that the three inner EMI springs 51 on each side of the CAGE 5 entrance matched with the optical module respectively and independently contact with the base EMI lug boss 11, the unlocking latch 221, and the upper cover EMI lug boss 31 one by one.

The purpose of setting the base EMI lug boss 11 on the base 1 is to increase the contact area between the base 1 and the corresponding EMI springs of the CAGE, and the purpose of setting the upper cover EMI lug boss 31 on the upper cover 3 is to increase the contact area between the upper cover 3 and the corresponding EMI springs of the CAGE.

Further, among the three inner EMI springs 51 on each side of the CAGE, the distance between the upper and lower inner EMI springs 51 is d, the first notch and the second notch of the unlocking latch 221 on each side are symmetrically arranged in the up-and-down direction, so that the upper and lower width d2 of the unlocking latch 221 at the first notch and the second notch is less than or equal to d.

The first notch and the second notch are isosceles trapezoid. The base EMI lug boss 11 and the upper cover EMI lug boss 31 are isosceles trapezoid.

The distance between the lower end surface of the base EMI lug boss 11 and the upper end surface of the upper cover EMI lug boss 31 on the same side is greater than d2.

Further, the effective matching length L between the base EMI lug boss 11, the unlocking latch 221, the upper cover EMI lug boss 31 on each side of the optical module and the three inner EMI springs 51 on the corresponding side of the CAGES entrance must meet the requirements that the base EMI lug boss 11, the unlocking latch 221 and the upper cover EMI lug boss 31 on each side of the optical module respectively and independently contact with the highest points of the three inner EMI springs 51 on the corresponding side of the CAGES entrance.

Further, the base 1 is provided with an EMI partition protrusion 12, the unlocking latch 221 is provided with an EMI partition groove 226, the EMI partition groove 226 extends along the sliding direction, and the EMI partition protrusion 12 on the base 1 is slidably fitted in the EMI partition groove 226 of the unlocking latch 221. The EMI partition groove 226 is to ensure that the unlocking latch221 will not interfere with the EMI partition protrusion 12 on the base 1 during the movement of the unlocking handle. The EMI partition protrusion 12 is located between the base EMI lug boss 11 and the upper cover EMI lug boss 31. The base 1 is provided with an EMI partition point (the EMI partition protrusion 12), which can break the matching gap between the unlocking latch 221 (sheet metal) and the base 1, shorten the gap by half, and improve the shielding efficiency.

Figure 12:
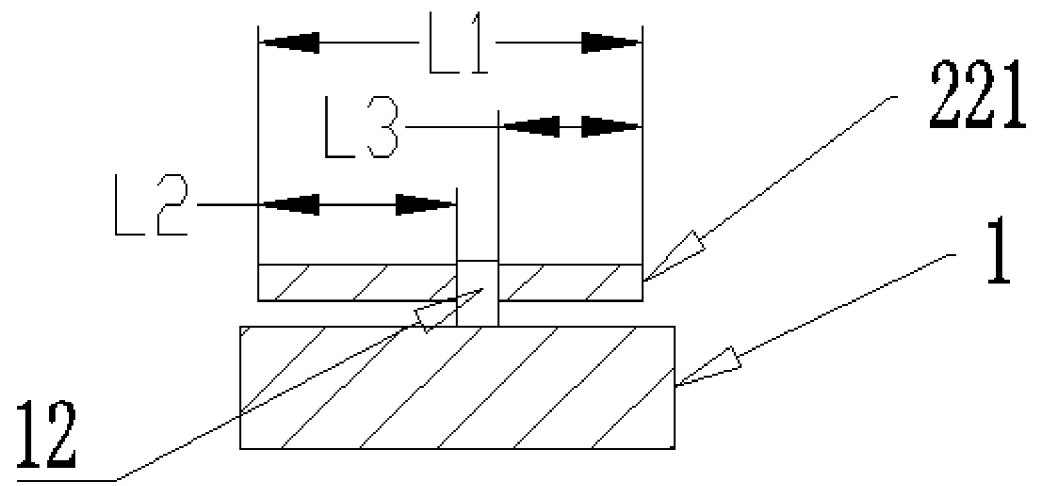
FIG. 12 shows the schematic diagram of the contact gap between the unlocking latch and the base of the optical module provided by an embodiment of the present invention.
Figure 13:
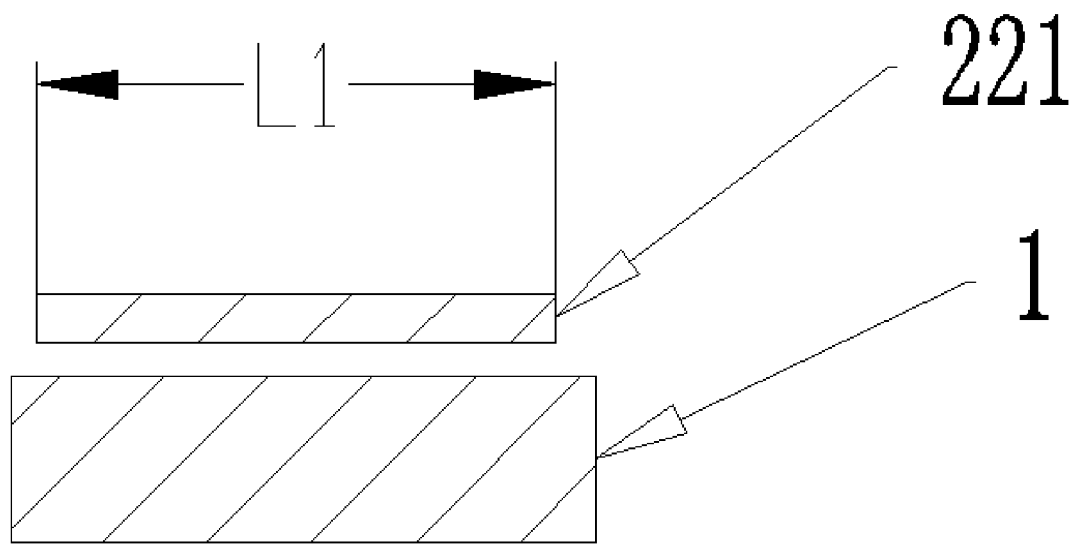
FIG. 13 shows the schematic diagram of the contact gap between the unlocking latch and the base of the optical module provided by a traditional method.

See FIG. 12 and FIG. 13, there will be a gap in the fit between the base 1 and the movable unlocking piece 22of the optical module, when this gap is not improved, its gap length is L1, after adding the EMI partition protrusion 12, the gap length L1 becomes L2+L3, which shortens the length of the fit gap. According to the shielding principle, the main way to improve the shielding effectiveness of the structure is to shorten the fit gap as much as possible.

Further, the end of the unlocking latch 221 on each side is provided with an unlocking EMI springs 223 for realizing the unlocking function, and make the corresponding CAGEEMI springs separate from the optical module to realize the unlocking function between the optical module and the CAGE. The unlocking area on the base 1 is mainly used for installing the unlocking EMI springs 223.

Further, the unlocking latch 221 is provided with an unlocking stroke control groove 227, the base 1 is provided with an unlocking stroke control lug boss 13, the unlocking stroke control lug boss 13 on the base 1 is slidably fitted in the unlocking stroke control groove 227 of the unlocking latch 221 to ensure that the movable unlocking piece 22 cooperates with the unlocking stroke control lug boss 13 on the base 1 during the movement process to realize the stroke control function, and limit the moving direction of the movable unlocking piece 22 at the same time. The unlocking stroke control lug boss 13 provided on the base 1 is mainly used to ensure that the unlocking device 2 can be assembled with the base 1 without falling out after being installed. At the same time, it controls the motion path of the unlocking device 2 and withstand the unlocking pulling force.

Further, the unlocking latch 221 is provided with an upwardly extending upper protrusion 224 and a downwardly extending lower protrusion 225 near the end of the unlocking latch 221, the base 1 is provided with a limit groove for slidably fitting with the upper protrusion 224 of the unlocking latch 221, the upper cover 3 is provided with a limit groove for slidably fitting with the lower protrusion 225, the upper protrusion 224 of the unlocking latch 221 extends into the corresponding limit groove of the base 1, and the lower protrusion 225 of the unlocking latch 221 extends into the corresponding limit groove of the upper cover 3, so as to ensure that the unlocking latch 221 will not move out of the limit groove during the movement.

Further, the base 1 is provided with a spring installation groove 14, and the spring installation groove 14 is provided with a spring 4, the movable unlocking piece 22 is provided with a reset latch 222 for covering the notch of the spring installation groove 14, and the reset latch 222 of the movable unlocking piece 22 is provided with a spring plectrum 228, the spring plectrum 228 of the movable unlocking piece 22 extends into the spring installation groove 14 to compress the spring, and the spring provides a reset force to the movable unlocking piece 22.

The unlocking device 2 of this embodiment is composed of two materials, the unlocking handle 21 is a plastic handle for drawing operations; the movable unlocking piece 22 is a sheet metal slide, which is mainly used to realize the unlocking function and EMI shielding. The movable unlocking piece 22 includes two unlocking latch 221 and a reset latch 222, the reset latch 222 spans between the two unlocking latch 221, and two sides of the reset latch 222 are respectively connected to the unlocking latch 221 on both sides. Both the unlocking latch 221 and the reset latch 222 are sheet metal slides.

EXAMPLE 2

See FIG. 1 to FIG. 9, this embodiment also discloses an electromagnetic shielding structure of the optical module, including a CAGE 5 and the optical module mentioned in Example 1, the optical module 5 is inserted into the CAGE 5, the three inner EMI springs 51 on the left and right sides of the CAGES entrance respectively and independently contact with the base EMI lug bosses 11, the unlocking latch 221, and the upper cover EMI lug bosses 31 on the left and right sides of the optical module one by one.

Further, the base EMI lug boss 11, the unlocking latch 221 and the upper cover EMI lug boss 31 on each side of the optical module respectively and independently contact with the highest points of the three inner EMI springs 51 on the corresponding side of the CAGES entrance.

Figure 2:
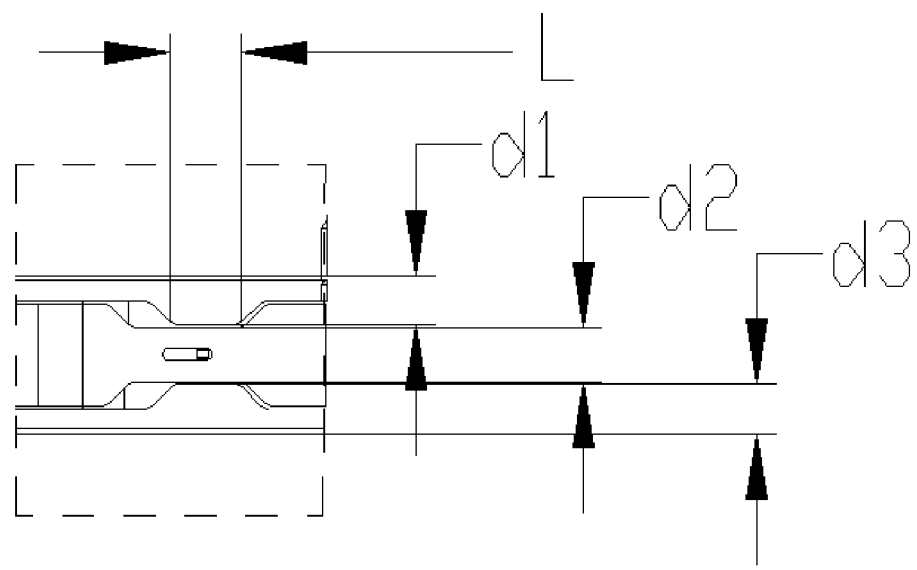
FIG. 2 shows the enlarged view of part P of FIG. 1.
Figure 3:
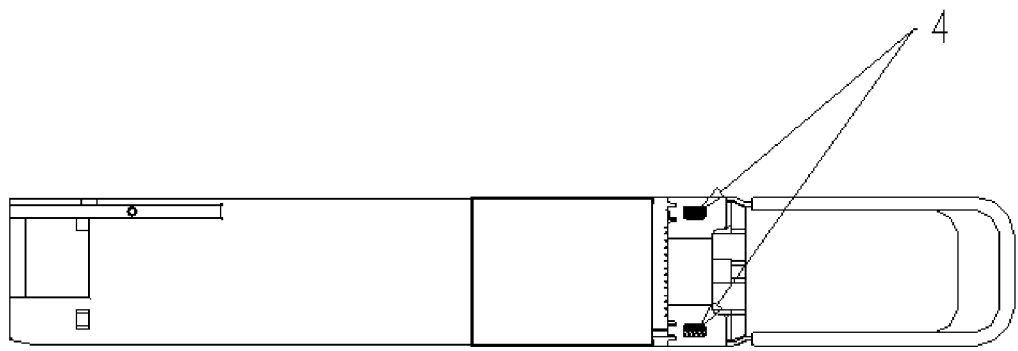
FIG. 3 shows the vertical view of FIG. 1.
Figure 4:
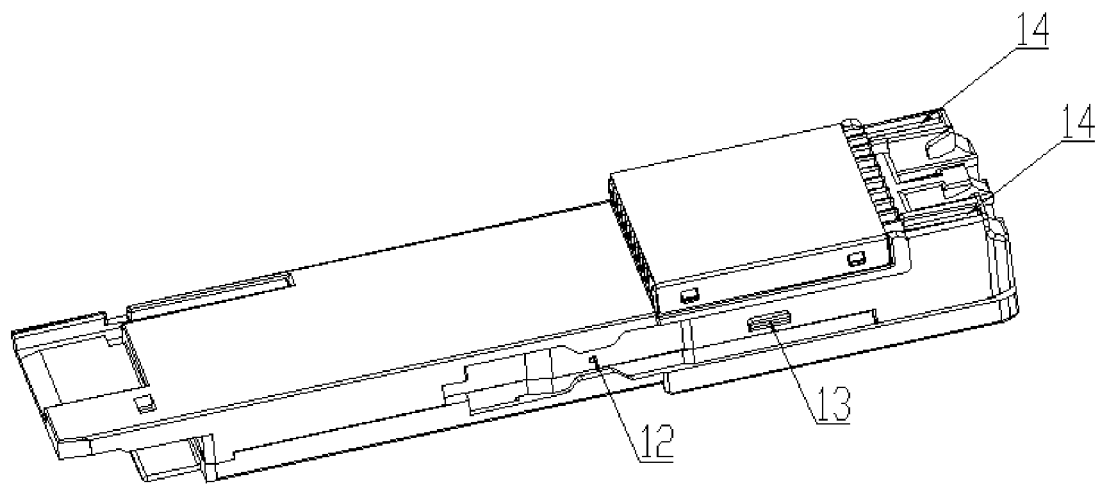
FIG. 4 shows the perspective view of the optical module after the base and the upper cover are butted and clamped.
Figure 5:
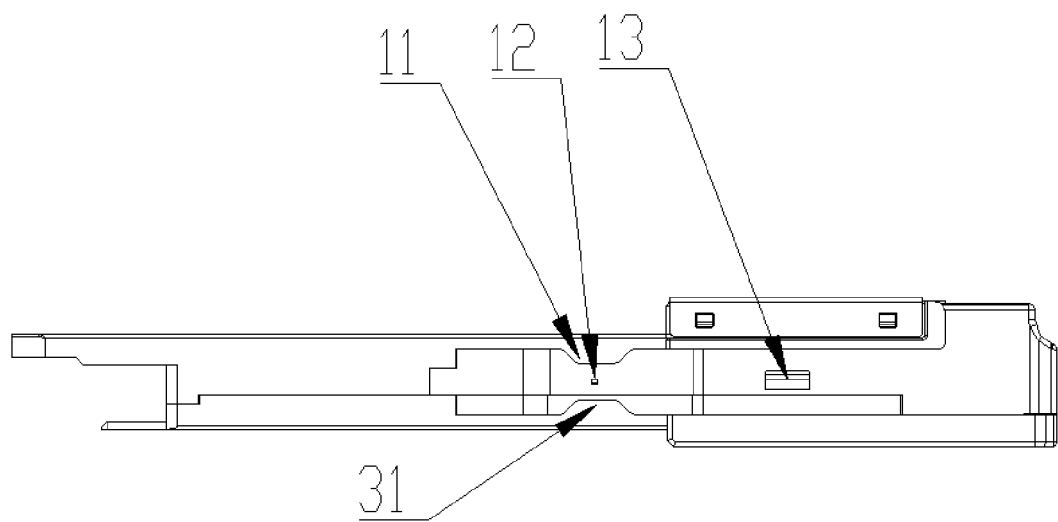
FIG. 5 shows the side view of FIG. 4.
Figure 6:
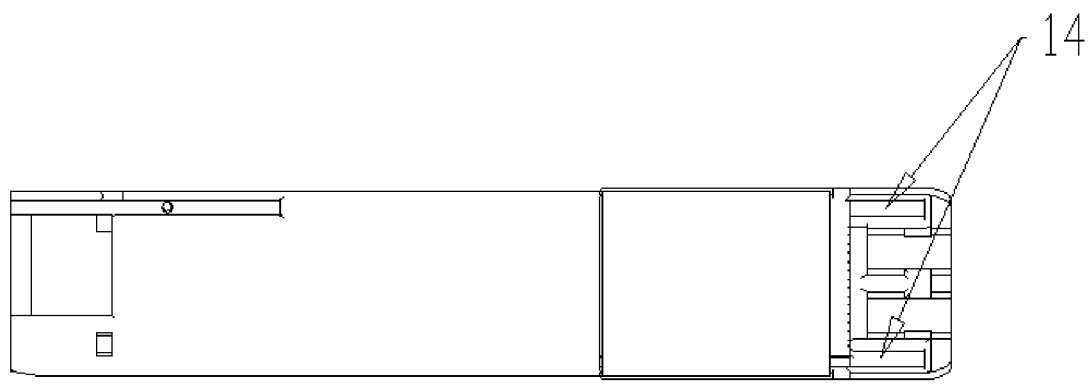
FIG. 6 shows the vertical view of FIG. 4.
Figure 7:
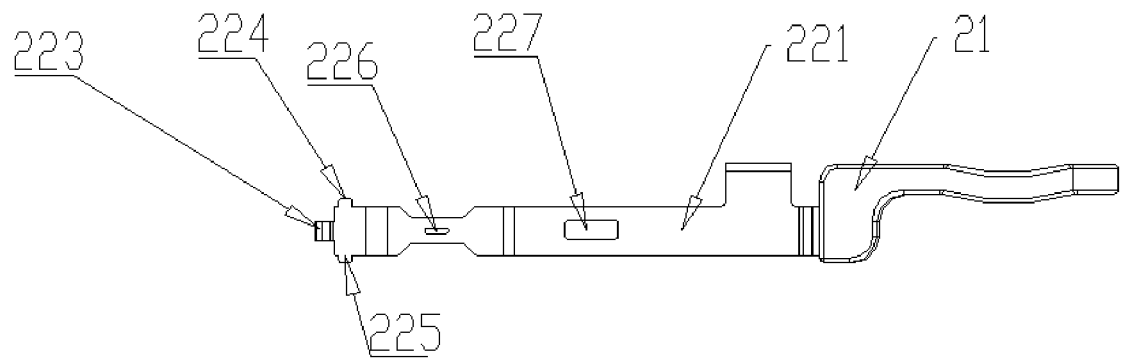
FIG. 7 shows the side view of the unlocking device of the optical module provided by an embodiment of the present invention.
Figure 8:
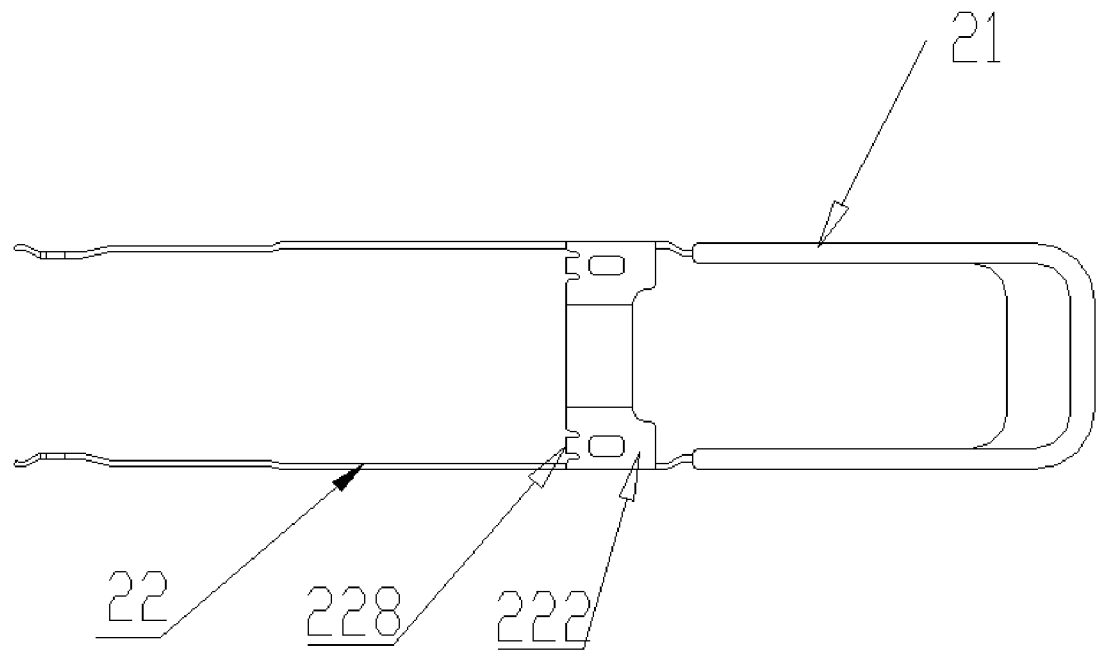
FIG. 8 shows the vertical view of FIG. 7.
Figure 9:
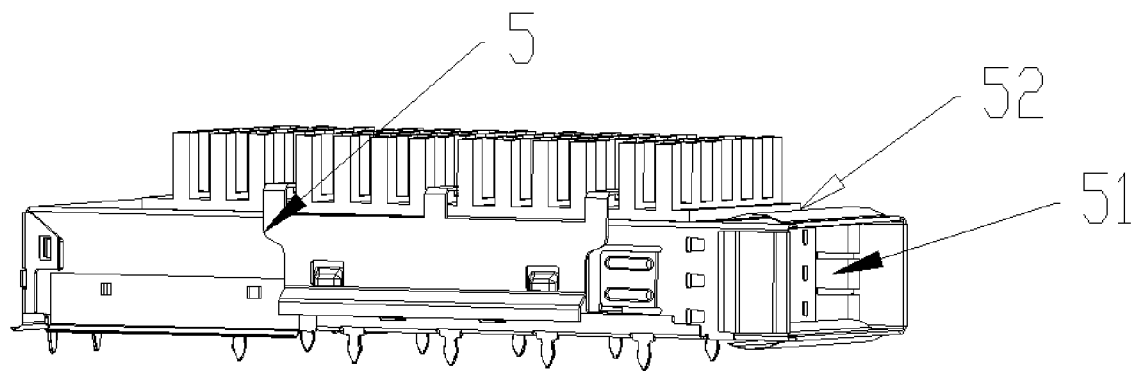
FIG. 9 shows the structure diagram of the squirrel rage.

The CAGES matched with the optical module is provided with outer EMI springs 52 and inner EMI springs 51, the left and right sides of the CAGE matched with the optical module are designed with three-stage inner EMI springs 51 of equal width and equal spacing. The improved optical module of the present invention can ensure that the three-stage inner EMI springs 51 can respectively contact the three-stage structural members (base EMI lug boss 11, unlocking latch 221, upper cover EMI lug boss 31), and avoid the same EMI springs spanning two parts at the same time, resulting in poor contact due to fit tolerances, which will affect the shielding effectiveness. FIG. 2 is a zoomed view of the EMI shielding area designed by the present invention, the distance between the upper end surface of the side of the base 1 and the lower end surface of the base EMI lug boss 11 is d1, the distance between the lower end surface of the side of the upper cover 3 and the upper end faces of the upper cover EMI boss 31 is d3, d1, d2, and d3 are in contact with the EMI springs respectively, and L is the effective length of the three sections to ensure contact with the highest point of the EMI springs.

Figure 10:
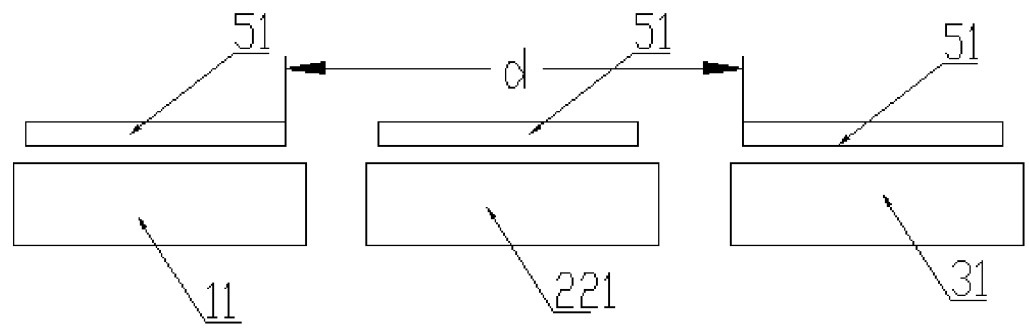
FIG. 10 shows the schematic diagram of the cooperation between the three inner EMI springs on one side of the CAGE and the structural parts of the optical module provided by an embodiment of the present invention.
Figure 11:
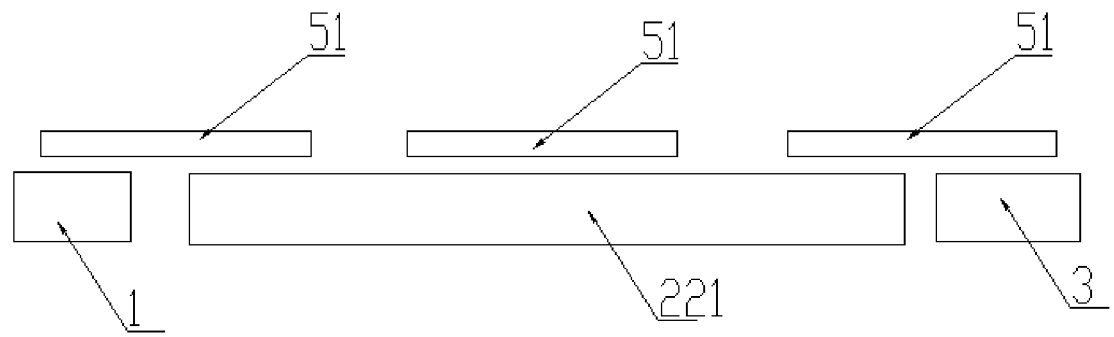
FIG. 11 shows the schematic diagram of the cooperation between the three inner EMI springs on one side of the CAGE and the structural parts of the optical module provided by a traditional method.

After assembly, the enlarged view of the matching area between the side of the optical module and the CAGEEMI springs is shown in FIG. 2, by controlling the dimensions of d1, d2, and d3, it can be ensured that the three parts of the side structure can respectively contact the three EMI springs of the CAGE; as for the assembly part, the plane formed by three parts is difficult to ensure that it is completely in one plane, so if the EMI springs of the CAGE is in contact with two parts at the same time, as shown in FIG. 11, the height difference between the two parts will lead to insufficient contact between the CAGEEMI springs and one of the parts, thereby reducing the shielding effectiveness of this position; see FIG. 10, the structural scheme provided by the present invention can ensure that the three EMI springs of the CAGE are in contact with the three parts independently, so as to avoid this problem, and effectively improve the shielding effectiveness of this position. The length L in FIG. 2 is to ensure the structure can be in contact with the highest point of the EMI springs.

The above descriptions are only preferred embodiments of the present invention and not intended to limit the present invention. Any modification, equivalent replacement, improvement, etc. made within the spirit and principle of the present invention shall be included in the protection scope of the present invention.

What is claimed is:

1. An optical module optimized for an electromagnetic radiation (EMI) shielding performance, comprising: a base, an upper cover, and an unlocking device connected by an unlocking handle and a movable unlocking piece wherein
   the base is butted and clamped with the upper cover to form a limiting groove for accommodating an unlocking latch on each of both sides of the movable unlocking piece, the unlocking latch is correspondingly slidably fitted in the limiting groove,
   an upper end of the unlocking latch on each side of the movable unlocking piece is provided with a first notch, wherein the first notch is used to make way for a base EMI lug boss set on the base,
   a lower end of the unlocking latch on each side of the movable unlocking piece is provided with a second notch, wherein the second notch is used to make way for an upper cover EMI lug boss set on the upper cover, and
   three inner EMI springs on each side of a CAGE entrance respectively and independently contact with the base EMI lug boss, the unlocking latch, and the upper cover EMI lug boss one by one.

2. The optical module according to claim 1, wherein among the three inner EMI springs on each side of the CAGE entrance, a distance between the upper inner EMI spring and the lower inner EMI spring is d, the first notch and the second notch of the unlocking latch on each side of the movable unlocking piece are symmetrically arranged in an up-and-down direction, and an upper and lower width d2 of the unlocking latch at the first notch and the second notch is less than or equal to the distance d.

3. The optical module according to claim 1, wherein an effective matching length L between the base EMI lug boss, the unlocking latch, the upper cover EMI lug boss on each side of the optical module and the three inner EMI springs on a corresponding side of the CAGE entrance meets requirements that the base EMI lug boss, the unlocking latch, and the upper cover EMI lug boss on each side of the optical module respectively and independently contact with highest points of the three inner EMI springs on the corresponding side of the CAGE entrance.

4. The optical module according to claim 1, wherein the base is provided with an EMI partition protrusion, the unlocking latch is provided with an EMI partition groove, the EMI partition groove extends along a sliding direction, and the EMI partition protrusion on the base is slidably fitted in the EMI partition groove of the unlocking latch.

5. The optical module according to claim 4, wherein the EMI partition protrusion is located between the base EMI lug boss and the upper cover EMI lug boss.

6. The optical module according to claim 1, wherein an end of the unlocking latch on each side of the movable unlocking piece is provided with an unlocking EMI spring for realizing an unlocking function; the unlocking latch is provided with an unlocking stroke control groove, the base is provided with an unlocking stroke control lug boss, the unlocking stroke control lug boss on the base is slidably fitted in the unlocking stroke control groove of the unlocking latch to ensure that the movable unlocking piece cooperates with the unlocking stroke control lug boss on the base during a movement process to realize a stroke control function, and limit a moving direction of the movable unlocking piece at the same time.

7. The optical module according to claim 1, wherein
the unlocking latch is provided with an upwardly extending upper protrusion and a downwardly extending lower protrusion near an end of the unlocking latch, the base is provided with a first limit groove for slidably fitting with the upwardly extending upper protrusion of the unlocking latch, the upper cover is provided with a second limit groove for slidably fitting with the downwardly extending lower protrusion, the upwardly extending upper protrusion of the unlocking latch extends into the first limit groove of the base, and the downwardly extending lower protrusion of the unlocking latch extends into the second limit groove of the upper cover, so as to ensure that the unlocking latch will not move out of the first limit groove and the second limit groove during a movement.

8. The optical module according to claim 1, wherein
the base is provided with a spring installation groove, and the spring installation groove is provided with a spring, the movable unlocking piece is provided with a reset latch for covering a notch of the spring installation groove, and the reset latch of the movable unlocking piece is provided with a spring plectrum, the spring plectrum of the movable unlocking piece extends into the spring installation groove to compress the spring, and the spring provides a reset force to the movable unlocking piece.

9. An electromagnetic shielding structure of an optical module, comprising
a CAGE and the optical module according to claim 1, the optical module is inserted into the CAGE, the three inner EMI springs on a left side and a right side of the CAGE entrance respectively and independently contact with the base EMI lug bosses, the unlocking latch, and the upper cover EMI lug bosses on a left side and a right side of the optical module one by one.

10. The electromagnetic shielding structure of the optical module according to claim 9, wherein
the base EMI lug boss, the unlocking latch, and the upper cover EMI lug boss on each side of the optical module respectively and independently contact with highest points of the three inner EMI springs on a corresponding side of the CAGE entrance.

11. The electromagnetic shielding structure of the optical module according to claim 9, wherein among the three inner EMI springs on each side of the CAGE entrance, a distance between the upper inner EMI spring and the lower inner EMI spring is d, the first notch and the second notch of the unlocking latch on each side of the movable unlocking piece are symmetrically arranged in an up-and-down direction, and an upper and lower width d2 of the unlocking latch at the first notch and the second notch is less than or equal to the distance d.

12. The electromagnetic shielding structure of the optical module according to claim 9, wherein an effective matching length L between the base EMI lug boss, the unlocking latch, the upper cover EMI lug boss on each side of the optical module and the three inner EMI springs on a corresponding side of the CAGE entrance meets requirements that the base EMI lug boss, the unlocking latch, and the upper cover EMI lug boss on each side of the optical module respectively and independently contact with highest points of the three inner EMI springs on the corresponding side of the CAGE entrance.

13. The electromagnetic shielding structure of the optical module according to claim 9, wherein the base is provided with an EMI partition protrusion, the unlocking latch is provided with an EMI partition groove, the EMI partition groove extends along a sliding direction, and the EMI partition protrusion on the base is slidably fitted in the EMI partition groove of the unlocking latch.

14. The electromagnetic shielding structure of the optical module according to claim 13, wherein the EMI partition protrusion is located between the base EMI lug boss and the upper cover EMI lug boss.

15. The electromagnetic shielding structure of the optical module according to claim 9, wherein an end of the unlocking latch on each side of the movable unlocking piece is provided with an unlocking EMI spring for realizing an unlocking function; the unlocking latch is provided with an unlocking stroke control groove, the base is provided with an unlocking stroke control lug boss, the unlocking stroke control lug boss on the base is slidably fitted in the unlocking stroke control groove of the unlocking latch to ensure that the movable unlocking piece cooperates with the unlocking stroke control lug boss on the base during a movement process to realize a stroke control function, and limit a moving direction of the movable unlocking piece at the same time.

16. The electromagnetic shielding structure of the optical module according to claim 9, wherein the unlocking latch is provided with an upwardly extending upper protrusion and a downwardly extending lower protrusion near an end of the unlocking latch, the base is provided with a first limit groove for slidably fitting with the upwardly extending upper protrusion of the unlocking latch, the upper cover is provided with a second limit groove for slidably fitting with the downwardly extending lower protrusion, the upwardly extending upper protrusion of the unlocking latch extends into the first limit groove of the base, and the downwardly extending lower protrusion of the unlocking latch extends into the second limit groove of the upper cover, so as to ensure that the unlocking latch will not move out of the first limit groove and the second limit groove during a movement.

17. The electromagnetic shielding structure of the optical module according to claim 9, wherein the base is provided with a spring installation groove, and the spring installation groove is provided with a spring, the movable unlocking piece is provided with a reset latch for covering a notch of the spring installation groove, and the reset latch of the movable unlocking piece is provided with a spring plectrum, the spring plectrum of the movable unlocking piece extends into the spring installation groove to compress the spring, and the spring provides a reset force to the movable unlocking piece.

* * * * *